United States Patent [19]

Schmid et al.

[11] Patent Number: 4,640,626
[45] Date of Patent: Feb. 3, 1987

[54] METHOD AND APPARATUS FOR LOCALIZING WEAK POINTS WITHIN AN ELECTRICAL CIRCUIT

[75] Inventors: Ralf Schmid, Rosenfeld; Johann Otto, Bad Toelz; Daniela Bernklau, Riemerling; Erwin Knapek, Unterhaching, all of Fed. Rep. of Germany

[73] Assignee: Siemens Aktiengesellschaft, Berlin and Munich, Fed. Rep. of Germany

[21] Appl. No.: 757,445

[22] Filed: Jul. 22, 1985

[30] Foreign Application Priority Data

Sep. 13, 1984 [DE] Fed. Rep. of Germany ....... 3433659

[51] Int. Cl.⁴ ............................................. G01R 31/00
[52] U.S. Cl. ....................................... 374/57; 374/161; 374/5; 324/158 R; 324/73 R; 250/310
[58] Field of Search ........................ 374/4, 5, 159, 161, 374/157; 324/52, 73 R, 158 R, 158 D

[56] References Cited

U.S. PATENT DOCUMENTS

| | | | |
|---|---|---|---|
| 3,396,335 | 8/1968 | Burr et al. | 374/4 |
| 3,549,999 | 12/1970 | Norton | 324/158 D |
| 3,678,384 | 7/1972 | Oatley | 324/73 R |
| 3,889,053 | 6/1975 | Lloyd et al. | 324/158 R |
| 3,934,199 | 1/1976 | Channin | 324/73 R |
| 4,215,562 | 8/1980 | Gavrilin et al. | 374/5 |
| 4,242,635 | 12/1980 | Burns | 324/158 R |
| 4,287,473 | 9/1981 | Sawyer | 324/158 R |
| 4,355,278 | 10/1982 | Burns et al. | 324/158 R |
| 4,407,008 | 9/1983 | Schmidt et al. | 358/93 |
| 4,431,967 | 2/1984 | Nishioka | 324/158 D |
| 4,466,746 | 8/1984 | Hancock et al. | 374/5 |

FOREIGN PATENT DOCUMENTS

| | | | |
|---|---|---|---|
| 2407945 | 8/1975 | Fed. Rep. of Germany | 324/158 R |
| 2069152 | 8/1981 | United Kingdom | 324/158 R |

OTHER PUBLICATIONS

Sawyer, D. E. et al., "Thermal Mapping of Transistors with a Laser Scanner", Proceedings of the IEEE, Nov. 1976, pp. 1634–1635.

Sawyer, D. E. et al., "Laser Scanning of Active Integrated Circuits and Discrete Semiconductor Devices", Solid State Technology, Jun. 1977, pp. 37–41 and 48.

Primary Examiner—Charles Frankfort
Assistant Examiner—Thomas B. Will
Attorney, Agent, or Firm—Hill, Van Santen, Steadman & Simpson

[57] ABSTRACT

A method and apparatus localize weak points within an electrical circuit. The electrical circuit is covered with a liquid crystal and is heated to a temperature just below the clearing point of the liquid crystal. The liquid crystal converts into its unordered condition given a temperature increase and leakage channel within the integrated circuit are completely localized. By irradiating a three-dimensional region, at least one current is induced in the region by generating electron-hole pairs within the electrical circuit, this at least one current causing a temperature increase at at least one weak point of the electrical circuit.

14 Claims, 4 Drawing Figures

METHOD AND APPARATUS FOR LOCALIZING WEAK POINTS WITHIN AN ELECTRICAL CIRCUIT

BACKGROUND OF THE INVENTION

1. Field of the Invention

The present invention relates to a method and to an apparatus for localizing weak points within an electrical circuit in which the circuit to be tested is covered with a liquid crystal and is heated to a temperature just below the clearing point of the liquid crystal, and in which the liquid crystal converts into its unordered condition given a temperature rise. The method is particularly characterized in that at least one current is produced by irradiating a three-dimensional region by generating electron-hole pairs within the electrical circuit, the at least one current causing a temperature rise at at least one weak point of the electrical circuit. The apparatus comprises a means for heating the electrical circuit comprising a liquid crystal on the surface of the electrical circuit and is particularly characterized by means for irradiating the three-dimensional region within the electrical circuit and for generating electron-hole pairs in the three-dimensional region.

2. Description of the Prior Art

Thermography, i.e. the measurement of temperature distributions on surfaces, is increasingly gaining in significance for the development and quality analysis of integrated circuits or of other current-permeated electrical components. The presently most sensitive method for identifying "hot spots" (locally limited thermally loaded regions) is temperature measurement with liquid crystal layers in a polarization microscope. The liquid crystal layers are applied to the surfaces to be investigated. The study of birefringence of the liquid crystal serves in the polarized light for the identification of structures of this liquid crystal. Conclusions can be drawn regarding temperature differences within the surface to be investigated from structural changes of the liquid crystal layer on the surface to be investigated. Electrical properties within this surface can then be concluded from the temperature differences within the surface to be investigated.

When a liquid crystal layer has been applied to the surface of an integrated circuit, the electrical property (dissipated power, temperature) of that location on the surface which is impinged by a laser beam can be concluded from the intensity of the reflection of a laser beam which occurs through the system liquid crystal layer/surface.

The principle of a "hot spot" detector is disclosed in the PCT application WO 83/01 989. This application is based on a U.S. application, Ser. No. 326,224, filed Dec. 1, 1981 now U.S. Pat. No. 4,466,746, and fully incorporated herein by this reference.

Only the hottest locations can be detected with such a known thermography method. A dosing of the temperature elevation for the detection of weak points which are more or less pronounced is not possible with such a known thermography method. A localization of leakage current channels with this known thermography method is therefore possible practically only in formulations.

As described in any textbook of scanning electron microscopy, a pn junction of a semiconductor diode can be imaged in a scanning electron microscope with the assistance of an induced specimen current (EBIC: Electron Beam Induced Current). Primary electrons thereby penetrate into the semiconductor diode with an energy of, for example, 20 keV. These primary electrons are thereby scattered and loose their energy in a so-called scatter volume. The primary electrons generate electron-hole pairs in this scatter volume by ionization. When the scatter volume is located at a sufficiently large distance from the pn junction of the semiconductor diode, then the electrons and holes recombine with one another after they have traversed, on average, a path corresponding to their respective diffusion lengths. When the primary electron beam migrates across the surface of the semiconductor diode and thereby approaches the pn junction, then diffusing charge carriers finally proceed into the influencing region of the electrical field of the space charge zone of the pn junction. The respective minority carriers are respectively accelerated onto the other side of the pn junction by this electrical field (electrons on the n side, holes on the p side). Given a closed external circuit, a "charge separation current" (EBIC) is present which can be measured, amplified and used, for example, for the intensity modulation of the picture tube of the scanning electron microscope.

A closed circuit which encompasses the leakage current channel to be localized is required for generating such a charge separation circuit (EBIC). Such a closed circuit at the leakage current, however, is generally not present within integrated circuits.

SUMMARY OF THE INVENTION

The object of the present invention is to provide a method and an apparatus of the type initially set forth with whose assistance leakage current channels within the integrated circuits can be completely localized.

The above object is achieved in a method for localizing weak points within an electrical circuit whereby the electrical circuit to be tested is covered with a liquid crystal and is heated to a temperature just below the clearing point of the liquid crystal, whereby the liquid crystal converts into its unordered condition given a temperature rise, and is particularly characterized in that at least one current is produced by irradiating a three-dimensional region by generating electron-hole pairs within the electrical circuit, the current causing a temperature rise and at least one weak point of the electrical circuit.

With the method of the invention, leakage current channels within integrated circuits can be displayed with the assistance of a liquid crystal as an indicator layer and with the assistance of a moving, focused probe as a stimulus for hot spots. The moving, focused probe can be a laser probe as disclosed, for example, in U.S. Pat. No. 4,407,008, fully incorporated herein by this reference. The moving, focused probe can also be some other light probe.

Local electron-hole pairs can be generated at the point of incidence of the probe. At least one local current is thereby induced. When the point of incidence of the probe is an arbitrary circuit node, different local currents can likewise be generated in different electrical conductors. The local currents elicit a temperature elevation in the electrical conductors in which they flow. The location of this temperature elevation is locally defined by the point of incidence of the probe. The more strongly pronounced a weak point within the integrated circuit, fewer and fewer electron-hole pairs must be generated in the immediate proximity of such a weak point so that the temperature elevation elicited at this weak point suffices to heat the liquid crystal covering the surface of the integrated circuit to such a degree that the weak point can be documented as such via a phase transition (structural conversion) of the liquid crystal. The number of electron-hole pairs generated depends on the intensity of the light radiation impacting the point of incidence. The intensity of the light radiation impinging the point of incidence must be all the higher the less pronounced the weak point is so that this pronounced weak point can be documented as a weak point by way of a phase conversion of the liquid crystal.

The wavelength of the light radiation impinging on the point of incidence defines the penetration depth of the probe. A depth profile within the integrated circuit can be recorded with respect to weak points by way of varying the wave length of the probe.

Since the method of the invention can be applied with particular advantage in the development of large scale integrated circuits and, since large scale integrated circuits to be investigated in this stage of development are not yet coated with an oxide layer, relatively low particle energies are adequate in order to generate electron-hole pairs, for example a particle energy of 5 keV in an electron probe suffices.

It is not only hottest locations, i.e. the most pronouned weak points, which can be documented within an integrated circuit with the method and with the apparatus of the invention but, rather, weak points which are less pronounced can also be documented by varying the intensity of the incident light radiation and by a corresponding adjustment of the temperature of the liquid crystal just below a structure conversion temperature at which the liquid crystal changes its optical properties.

No special, external closed circuit is required, for example, in EBIC the same is not needed given the method and the apparatus of the present invention for the detection of weak points or, respectively, of a leakage current channel.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
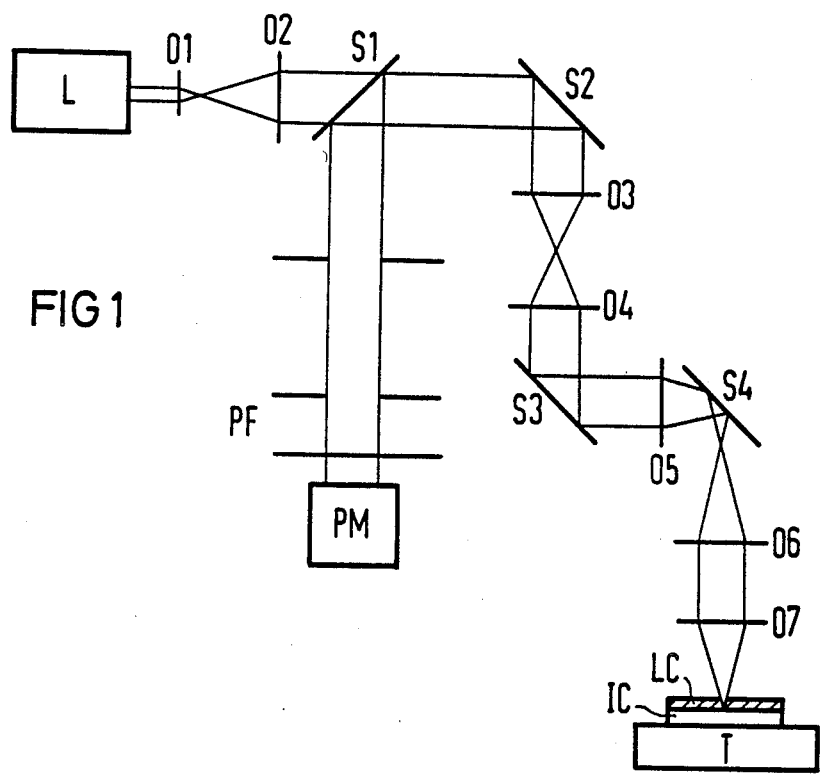
FIG. 1 is a schematic representation of an embodiment of the present invention.

FIG. 1 illustrates an apparatus constructed in accordance with the present invention. As in liquid crystal thermography, the integrated circuit IC to be investigated is covered with a liquid crystal LC and is heated on a hot table T to a temperature which lies just below the clearing point of the liquid crystal LC. Below the clearing point, the liquid crystal LC comprises ordered regions which appear as luminously bright regions in a picture screen (not shown in FIG. 1) after passage of the light reflected at the surface of the integrated circuit IC through the polarization filter PF and after processing of the reflected light in a photomultiplier PM. Above the clearing point, the liquid crystal LC comprises an unordered, amorphous structure. After reflection of the light at the surface of the integrated circuit LC, such unordered regions of the liquid crystal LC appear dark on the image following the polarization filter PF and following the photomultiplier PM.

The integrated circuit IC is preferably operated at the upper limit of the supply voltage. As a result of irradiation with the light of a laser L, in a laser scanning microscope, currents are generated at discrete, spatially defined locations by generating electron-hole pairs at the point of incidence of the laser light. These currents cause a spatially punctiform temperature rise at weak points within the electrical circuit in the immediate or further proximity of the point of incidence of the light radiation. When generating low currents, weak points can only be documented in the immediate proximity of the point of incidence of the laser light. When generating high currents as a consequence of a high intensity of the impinging laser light, weak points which lie at a greater distance from the point of incidence of the laser light can also be documented, i.e. the electrical connection between the point of incidence and the weak point can also be longer.

A laser scanning microscope, as disclosed in U.S. Pat. No. 4,407,008, fully incorporated herein by this reference, can be employed, for example, as the laser scanning microscope. The light of the laser L is:

focused with the assistance of a lens 01;
collimated with the assistance of a lens 02;
deflected by 90° by a mirror S2;
focused with the assistance of a further lens 03;
again collimated with a further lens 04;
deflected by a variable angle of approximately 90° by a mirror S3;
again focused by a lens 05;
simultaneously deflected by a variable angle of approximately 90° by a mirror S4;
again collimated with the assistance of a further lens 06; and
finally focused onto the object with the assistance of a final lens 07.

The light reflected at the object first traverses the same beam path in the reverse direction, and is then deflected by 90° by a semi-transmissive mirror S1 in front of the lens 01 on its return path and then traverses the polarization filter PF in order, finally, to be further processed in the photomultiplier PM.

The mirrors S3 and S4 which are variable in terms of their three-dimensional disposition enable the adjustment of the focused light beam to any desired discrete point on the surface of the integrated circuit IC and, therefore, also enable a scanning of this surface of the integrated IC.

When the laser scanning microscope is operated as a polarization microscope, the spatial, local temperature rise at a weak point is registered in the laser scanning microscope as a conversion of the liquid crystal LC into its amorphous, unordered condition at this spatial local point of the weak point ("hot spot"). The advantage of such a method is that the high current, i.e. high temperature can be caused such that it remains locally limited. It can therefore be prevented that such a temperature elevation which is caused by a cause of no interest would lead to a conversion of the overall liquid crystal LC from the ordered phase into the unordered phase. Such a cause of no interest may be seen, for example, in that, as a consequence of a current supply of larger portions of the integrated circuit IC or the entire circuit IC, some components gradually become hot proceeding from the exterior, these components being completely uninteresting in the surge for a weak point in a specific portion of the integrated circuit IC.

Electronic components can be tested in any operating mode with such a method. A special, external circuit for error recognition is not necessary given such a method. Such a method enables the direct discovery of weak points without specific test patterns having to be applied to an integrated circuit IC.

Weak points or, respectively, leakage current channels at greater depths of the integrated circuit IC can be made visible by long-wave lasers, for example in the infrared range, which have a high penetration depth. When a variable frequency laser L is employed or when different lasers L having different wave lengths are employed, depth profiles of the integrated circuit IC can be recorded with respect to weak points.

Figure 2:
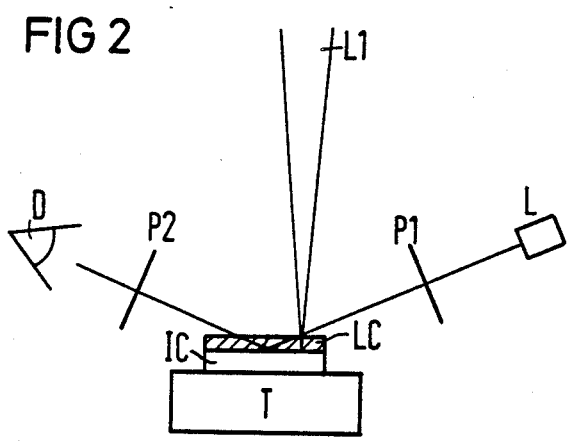
FIG. 2 is a schematic representation of apparatus for carrying out the present invention.

FIG. 2 illustrates a further apparatus for practicing the invention. The integrated circuit IC to be tested is again covered with a liquid crystal LC and is located on a hot table T whose temperature is heated up to just below the clearing point of the liquid crystal LC. The temperature of the liquid crystal LC is set, for example, such that it is about $\frac{1}{2}$K below that temperature at which the liquid crystal LC converts into its amorphous, non-crystalline condition. Proceeding from a light source L, a location to be investigated on the surface of the integrated circuit IC is radiated with light to a first polarizer P1. This light is reflected at the system interface of the liquid crystal LC and the surface of the integrated circuit IC. This reflected light proceeds through a second polarizer P2 to a detector D, for example a human eye. The polarizers P1, P2 are disposed crossed. When, for example, MBBA (N-(p-methoxy-benzylidene)-p-n-butylaniline) is employed as a liquid crystal, and the two crossed polarizers P1, P2 are disposed at angular positions 45° relative to one another, then a crystalline region of the liquid crystal LC appears bright at the detector D. When, due to a temperature increase, a three-dimensional region of the liquid crystal LC has converted into the amorphous condition, then the clear liquid crystal LC appears dark in the reflection at the detector D. The temperature rise in a three-dimensionally limited region, for example a weak point within an integrated circuit, is thereby produced by a radiation of a spatially-locally defined location with the assistance of a second light beam L1. More or less high currents are thereby produced at the point of incidence of the second light beam L1 by generating electron-hole pairs, these currents causing a three-dimensional local temperature increase at weak points of the integrated circuit LC. This apparatus offers the advantage that other locations within the electrical circuit can also be viewed, namely locations other than that location which is heated with the second light beam L1. As a result, locations other than that location which is heated with a second light beam L1 can also be detected as weak points.

Figure 3A:
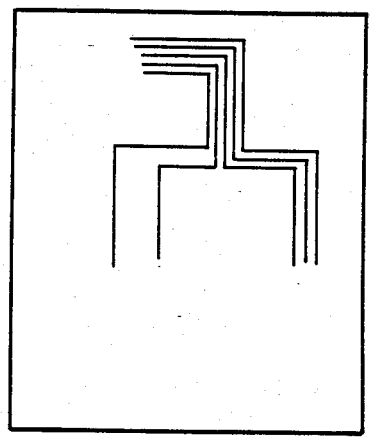
FIGS. 3a and 3b illustrate a result obtained with the assistance of the present invention.
Figure 3B:
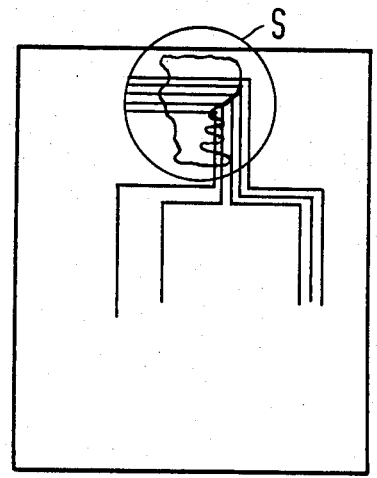

FIG. 3a and FIG. 3b illustrate the result of a measurement with the method and apparatus of the present invention. FIG. 3a illustrates a scan imaging of the surface of an integrated circuit IC with the assistance of a laser scanning microscope. The laser scanning microscope is thereby operated as a polarization microscope and successively scans the entire surface or a portion of the surface of the integrated circuit IC.

FIG. 3b shows the same image as in FIG. 3a. Before the image of FIG. 3b was generated, relatively high currents where, however, generated in the region of the "hot spot" S. When flowing through a weak point ("hot spot" S), these high currents have effected a heating and, therefore, a conversion of the liquid crystal LC into its amorphous condition. A laser scanning microscope can be operated as and to generate a laser probe. However, it is also conceivable that an additional laser supplies the light required for generating the electron-hole pairs.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method for localizing weak points within an integrated circuit, comprising the steps of:
   covering a surface of the integrated circuit with a liquid crystal material;
   heating the liquid crystal material to a temperature just below its clearing temperature wherein said liquid crystal material is in an ordered condition; then
   radiating a three-dimensional region of the integrated circuit with polarized light whereby the radiation not reflected from the surface of the integrated circuit generates electron-hole pairs and thereby produces at least one current which causes a temperature rise at a weak point of the integrated circuit sufficient to induce conversion of the adjacent liquid crystal material from said ordered condition into an unordered condition; and
   detecting the unordered condition by sensing the radiation reflected from the surface of the integrated circuit in the region of the weak point.

2. The method of claim 1, wherein the step of detecting is further defined as:
   observing the liquid crystal material with a scanning laser microscope operating as a polarization microscope.

3. The method of claim 1, wherein the step of radiating is further defined as:
   radiating the three-dimensional region with a laser beam in a scanning laser microscope.

4. The method of claim 1, wherein the integrated circuit has a supply voltage, and further comprising the step of:
   operating the integrated circuit at the upper limit of the supply voltage.

5. The method of claim 1, wherein the step of radiating is further defined as:
   varying the wave length of the polarized light so that weak points at various depths of the integrated circuit may be detected.

6. The method of claim 5, and further comprising the step of:
   recording a depth profile for weak points at various depths of the integrated circuit.

7. A method for localizing weak points within an integrated circuit, comprising the steps of:

covering a surface of the integrated circuit with a liquid crystal material;

heating the liquid crystal material to a temperature just below its clearing temperature wherein said liquid crystal material is in an ordered condition; then generating a first light beam and directing the first light beam towards the surface of the integrated circuit;

polarizing the first light beam with a first polarizer so that the polarized light beam is incident and reflected at the surface of the integrated circuit;

analyzing the reflected polarized light beam with a second polarizer which is crossed with respect to the first polarizer to produce a bright region;

radiating a three-dimensional region of the integrated circuit with a second polarized light beam which locally generates electron-hole pairs and thereby produces local currents which cause a three-dimensional local temperature rise at weak points of the integrated circuit sufficient to induce conversion of the adjacent liquid crystal material into an unordered condition causing scattering of the first polarized light and a dark spot for each weak point; and detecting dark spots by sensing a change in intensity of the reflected first light beam.

8. The method of claim 7, wherein the steps of polarizing are further defined as:

crossing the first and second polarizer at an angle of 45° relative to one another.

9. The method of claim 7, wherein the step of covering the surface of the integrated circuit with a liquid crystal material is further defined as:

covering the surface of the integrated circuit with MBBA (N-(p-methoxy-benzylidene)-p-n-butylaniline.

10. Apparatus for localizing weak points within an integrated circuit, comprising:

a liquid crystal material carried on a surface of the integrated circuit;

heating means for heating the integrated circuit and said liquid crystal material to a temperature just below the clearing temperature of the liquid crystal material wherein said liquid crystal material is in an ordered condition;

radiation means for radiating a three-dimensional region within the integrated circuit with polarized light whereby the radiation not reflected from the surface of the integrated circuit generates electron-hole pairs and a current flow which causes a temperature increase at a weak point in the integrated circuit and a corresponding conversion of the adjacent liquid crystal material into an unordered condition; and detection means for detecting the unordered condition as a weak point by sensing the radiation reflected from the surface of the integrated circuit.

11. The apparatus of claim 10, wherein:

said radiation means and said detection means are constituted by a scanning laser microscope.

12. The apparatus of claim 10, wherein said radiation means comprises a laser generator.

13. The apparatus of claim 10, wherein:

said radiation means comprises a variable light wave length laser generator.

14. The apparatus of claim 10, and further comprising:

means for generating and directing a light beam towards the interface of said liquid crystal material and the integrated circuit;

a first polarizer for polarizing the light beam prior to incidence at the interface; and a second polarizer, crossed relative to said first polarizer, and disposed between said interface and said detection means for repolarizing reflected light so that said liquid crystal material appears bright with the exception of weak points which cause scattering of the first polarized light.

* * * * *